(12) United States Patent
Draxelmayr et al.

(10) Patent No.: US 8,487,664 B2
(45) Date of Patent: Jul. 16, 2013

(54) SYSTEM AND METHOD FOR DRIVING A SWITCH

(75) Inventors: Dieter Draxelmayr, Villach (AT); Karl Norling, Villach (AT)

(73) Assignee: Infineon Technologies AG, Neubiberg (DE)

( * ) Notice: Subject to any disclaimer, the term of this patent is extended or adjusted under 35 U.S.C. 154(b) by 70 days.

(21) Appl. No.: 12/956,852

(22) Filed: Nov. 30, 2010

(65) Prior Publication Data

US 2012/0133397 A1 May 31, 2012

(51) Int. Cl.
*H03K 3/00* (2006.01)

(52) U.S. Cl.
USPC ............ 327/108; 327/112; 327/387; 327/589

(58) Field of Classification Search
USPC .................. 327/108–112, 387–391, 588–589
See application file for complete search history.

(56) References Cited

U.S. PATENT DOCUMENTS

| | | | |
|---|---|---|---|
| 4,663,547 A | 5/1987 | Baliga et al. | |
| 5,155,398 A | 10/1992 | Mikuni et al. | |
| 5,365,118 A | 11/1994 | Wilcox | |
| 5,408,150 A * | 4/1995 | Wilcox | 327/108 |
| 6,825,700 B2 * | 11/2004 | Hano | 327/108 |
| 7,187,226 B2 | 3/2007 | Audy | |
| 7,471,121 B2 | 12/2008 | Yang et al. | |
| 7,479,773 B2 | 1/2009 | Michishita | |
| 7,514,908 B2 * | 4/2009 | Hosokawa et al. | 323/222 |
| 8,120,391 B2 | 2/2012 | Bayerer et al. | |

FOREIGN PATENT DOCUMENTS

DE    10 2006 029 928 B3    9/2007

OTHER PUBLICATIONS

Muenzer, M., et al. "Insulated Signal Transfer in a Half Bridge Driver IC Based on Coreless Transformer Technology," 4 pages, Infineon Technologies.

* cited by examiner

*Primary Examiner* — An Luu
(74) *Attorney, Agent, or Firm* — Slater & Matsil, L.L.P.

(57) ABSTRACT

In accordance with an embodiment, a circuit for driving a switch includes a driver circuit. The driver circuit includes a first output configured to be coupled to a gate of the JFET, a second output configured to be coupled to a gate of the MOSFET, a first power supply node, and a bias input configured to be coupled to the common node. The switch to be driven includes a JFET coupled to a MOSFET at a common node.

25 Claims, 10 Drawing Sheets ly assigned U.S. patent applications: Ser. No. 12/956,813, filed on Nov. 30, 2010 entitled "System and Method for Boostrapping a Switch Driver," and Ser. No. 12/956,696, filed on Nov. 30, 2010 entitled "System and Method for Driving a Cascode Switch," which applications are hereby incorporated herein by reference in their entirety.

TECHNICAL FIELD

The present invention relates generally to electronic circuits, and more particularly to a system and method for driving a switch.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. In some power supply systems, combinations of switches are arranged in a bridge configuration such as a half-bridge, full-bridge, or a multi-phase bridge. When very high voltages are generated by the power supply, it is beneficial to use switches, such as junction field effect transistor (JFET) devices, that have both a high breakdown voltage and a low on-resistance. The high breakdown voltage of a JFET allows for reliable operation even with output voltages of hundreds or even over a thousand volts. The low on-resistance of the JFET device allows for efficient operation of the power supply system.

JFET devices have the property that they are self-conducting or "normally on devices," meaning that the devices conduct electricity when the gate-source voltage of the JFET is at about zero volts. Such a property poses difficulties because the switch transistors appear as short circuits before the power supply system is fully biased, thereby causing high currents to be generated at the startup of the power supply. In some high efficiency JFET devices used for power supply switching, this pinch-off voltage may be around negative 15 volts. Therefore, this negative voltage is generated before the power supply begins full operation when the JFET can be fully shut off.

In some power supplies, biasing voltages are developed at startup by using transformers. The use of transformers, however, is expensive. In other power supplies, voltages are developed at startup by using bootstrap techniques, in which the energy of switching nodes within the power supply circuit is used to charge capacitors that provide the local power supply for the switching transistors. When JFETs are used, however, such bootstrapping techniques are difficult to apply. For example, when the internal supply voltage of the power supply system is low at startup, the JFET switches may not operate because the voltages required to allow the JFETs to switch on and off has not yet been developed. If the JFET switches do not operate, then the internal supply voltages needed to make the switches operate cannot be generated.

SUMMARY OF THE INVENTION

In accordance with an embodiment, a circuit for driving a switch includes a driver circuit. The driver circuit includes a first output configured to be coupled to a gate of the JFET, a second output configured to be coupled to a gate of the MOSFET, a first power supply node, and a bias input configured to be coupled to the common node. The switch to be driven includes a JFET coupled to a MOSFET at a common node.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely switch drivers in switched mode power supply systems. Embodiments of the invention may also be applied to switch drivers in other electronic applications such as solar inverters, telecom, servers and uninterruptible power supplies.

Figure 1A:
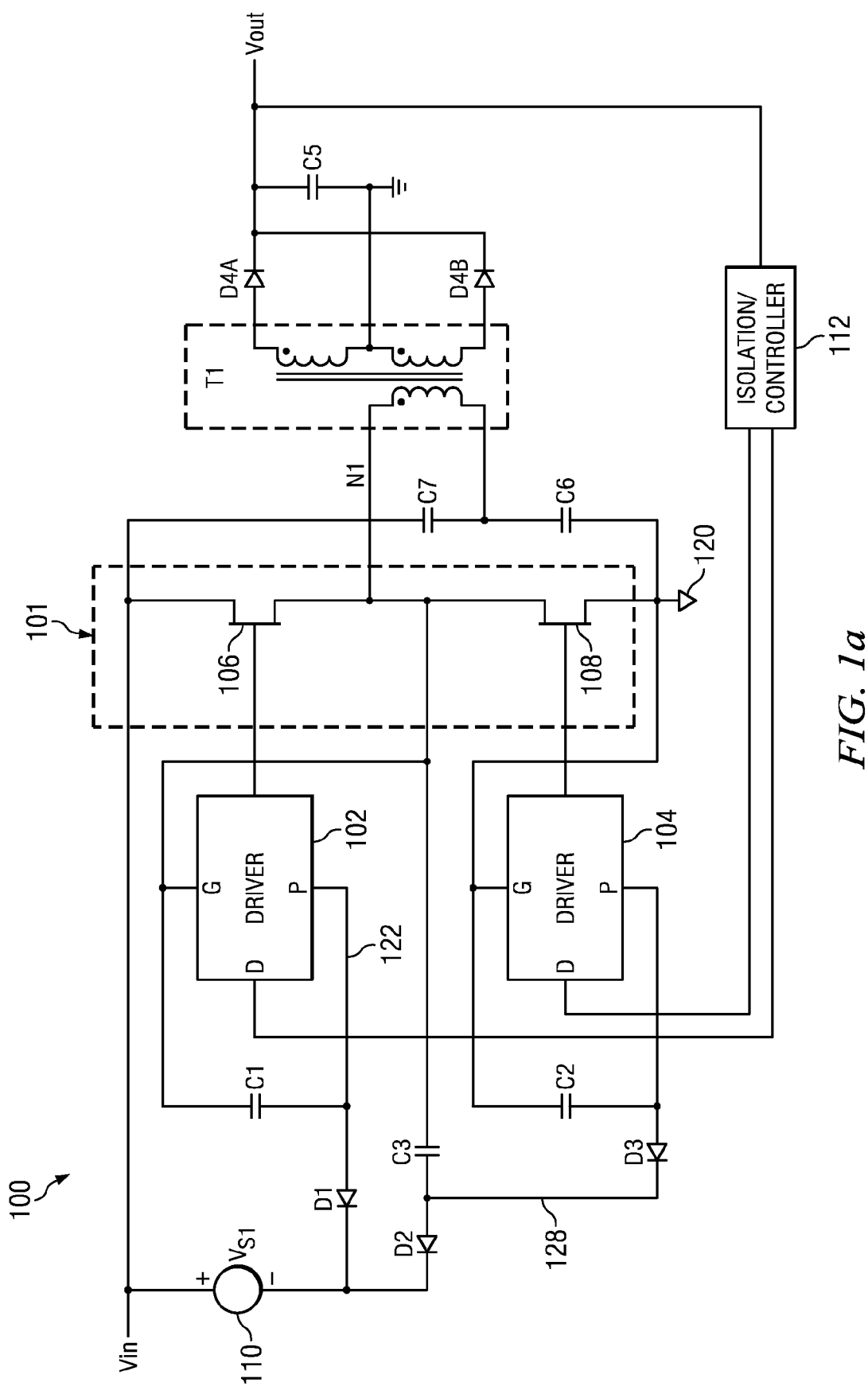
FIGS. 1a-1b illustrate power supply systems according to embodiments of the present invention.

FIG. 1a illustrates power supply system 100 according to an embodiment of the present invention. Input voltage Vin is applied across half-bridge 101 circuit having high-side switch 106 and low-side switch 108. In an embodiment, each switch 106 and 108 is made of a JFET and a MOSFET coupled in series. Alternatively, other switch configurations can be used. During operation of power supply system, high-side driver 102 drives high-side switch 106 and low-side driver 104 drives low-side switch 108. In an embodiment, high-side switch 106 and low side switch 108 are driven in an alternate manner such that only one switch is conducting at a particular time. In some embodiments, output voltage Vout is controlled according to the relative duty cycles of the conductive states of high-side switch 106 and low side switch 108, and according to the turns ratio of transformer T1.

Output N1 of half-bridge circuit 101 is coupled to the primary winding of transformer T1, the secondary winding of which is coupled to rectifying diodes D4A and D4B. Rectifying diodes D4 and D5 rectifies the output of the secondary winding of transformer T1, and capacitor C5 filters the rectified output of diodes D4 and D5. In an embodiment, voltage Vout is sensed by isolation/controller block 112, which generates input signals for high-side driver 102 and low-side driver 104. In an embodiment, isolation/controller provides electrical isolation between the primary and secondary sides of transformer T1 using, for example, isolation circuits such as optoisolators, transformers, and other isolation devices known in the art. In an embodiment, isolation/controller block can be configured to provide a predetermined output voltage at Vout.

In an embodiment, power is provided to high-side driver 102 across terminal G, which is coupled to output N1 of half-bridge circuit 101, and terminal P, which is coupled to capacitor C1 and diode D1 at node 122. When node N1 experiences a positive voltage transition, node 122 is driven high until diode D1 becomes forward biased at a Vin$-V_{S1}+V_{DS1}$, where $V_{DS1}$ is the junction voltage of diode D1 and $V_{S1}$ is the voltage of power supply 110. When node N1 is at voltage Vin, a voltage of about $V_{S1}-V_{DS}$ is across capacitor C1. When node N1 begins to experience a negative voltage transition, diode D1 becomes reversed biased, and a voltage of about $V_{S1}-V_{DS1}$ is maintained across capacitor C1. In some embodiments, the voltage across capacitor C1 will decay according to the size of capacitor C1 and the current consumed by driver 102. In an embodiment, $V_{S1}$ is selected to be at least sufficient to shut off the JFET in high-side switch 106. In embodiments where high-side switch includes a JFET, VS1 is selected to be at least greater than the magnitude of the pinch-off voltage of the JFET, for example, between about 10 V and about 15 V. In alternative embodiments, other values can be used according to the application, its requirements, and the characteristics of the individual devices used in the circuit.

In an embodiment, power is provided to low-side driver 104 across terminal G, which is coupled to system ground 120, and terminal P, which is coupled to capacitor C2 and D3. When node N1 experiences a positive voltage transition, node 128 is driven high until diode D2 becomes forward biased at a Vin$-V_{S1}+V_{DS2}$, where $V_{DS2}$ is the junction voltage of diode D2. When node N1 is at voltage Vin, a voltage of about $V_{S1}-V_{DS2}$ is across capacitor C3. When node N1 begins to experience a negative voltage transition, diode D2 becomes reversed biased and a voltage of about $V_{S1}-V_{DS2}$ is maintained across capacitor C3. Node 128 follows node N1 as it continues its negative voltage excursion. When node N1 is at system ground 120, node 128 is at a voltage of approximately VDS2$-V_{S1}$, and capacitor C2 charges to a voltage of approximately $V_{DS3}+V_{DS2}-V_{S1}$ if the effect of the discharge of C2 and capacitive charge sharing between C2 and C3 is neglected, where $V_{DS3}$ is the junction voltage of diode D3. In some embodiments, the voltage across capacitor C2 will decay according to the size of capacitor C2 and the current consumed by driver 104. As the voltage decays across C2, however, more charge is introduced to capacitor C2 via diode D3 so that the voltage across terminals P and G of driver 104 are maintained at a sufficient voltage to operate a JFET within low-side switch 108.

In an embodiment, values for C1, C2 and C3 are each between about 10 µF and about 100 µF, and VS1 set to be between about 20V and about 30V. In one embodiment, Vin is about 400V and Vout is about 12V, 48V or 400V. In alternative embodiments, other component and voltage values can be used depending on the specific application and its specifications.

Figure 1B:
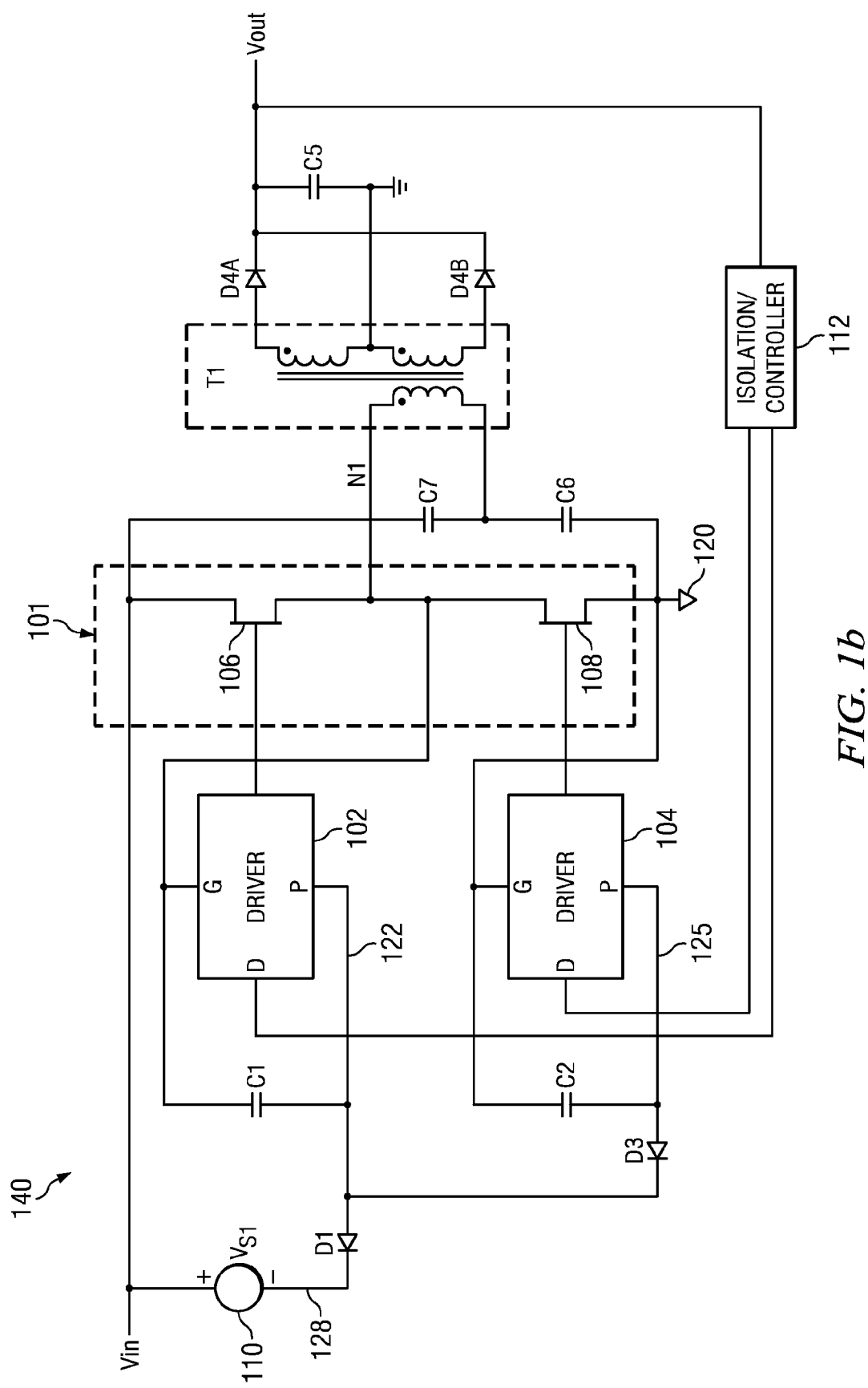

It should be appreciated that the circuit illustrated in FIG. 1*a* is one example of how inventive concepts can be applied to a power supply system. In alternative embodiments, other power supply topologies can be used besides the topology shown in FIG. 1*a*. For example, FIG. 1*b* illustrates alternative embodiment power supply system 140, which is similar to power supply system 100 illustrated in FIG. 1*a*, with the exception that capacitor C3 and diode D2 are omitted, and diode D3 is coupled between nodes 125 and 122. Here, the embodiment of FIG. 1*b* uses fewer components than the embodiment of FIG. 1*a*.

Further embodiments of the present invention can be applied to converters including, but not limited to buck converters, boost converters, and buck-boost converters. Alternative embodiment power supply topologies can also include power supplies using inductors instead of transformers, or topologies using both inductors and transformers.

Figure 2:
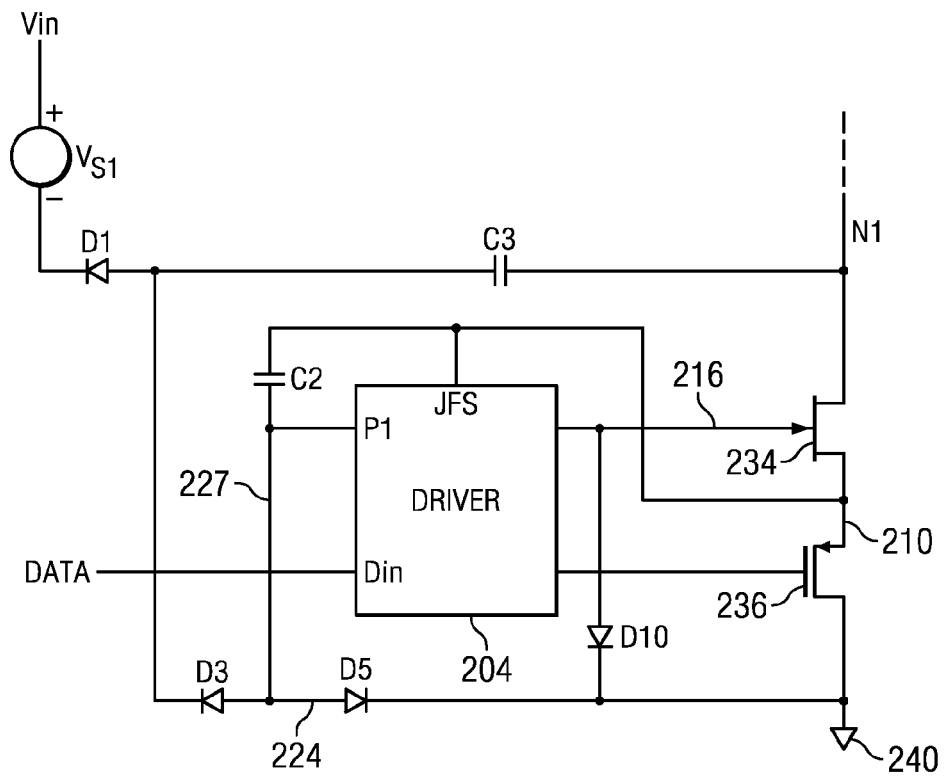
FIG. 2 illustrates an embodiment switch driver system.

FIG. 2 illustrates a low-side portion of a half-bridge circuit and its associated driving circuits according to another embodiment of the present invention. Here, the low-side switch is made of n-channel JFET 234 and PMOS device 236 and is driven by driver 204. Alternatively, other device types, such as an NMOS device can be coupled in series with JFET 234 instead of PMOS device 236. During nominal operation of the power supply system, PMOS device 236 is turned on persistently while JFET 234 is switched on and off, thereby charging capacitor C2 as described hereinabove with respect to FIG. 1*a*. Switching data is input to driver 204 via signal Data.

During startup, PMOS 236 is shut off when node 224 does not have sufficient negative voltage to shut off JFET 234. By shutting off PMOS 236, a short circuit is prevented from occurring in the half-bridge circuit during startup. Assuming that node N1 has a sufficiently high voltage at startup, for example, greater than 20V, and the gate of JFET 234 is coupled to system ground 240 at node 216, the voltage at node 210 will be the pinch-off voltage of JFET 234. In one embodiment, this is about 15V, however, in alternative embodiments this voltage will differ according to the device characteristics of JFET 234. Here, the pinch-off voltage is stored on capacitor C2, which provides driver 204 a sufficient voltage to operate the internal logic of driver 204. In an embodiment, diode D10 is coupled between the gate of JFET 234 and system ground 240 to prevent the gate of JFET 234 from going significantly higher than system ground 240.

In an embodiment, the driver switches PMOS device on and off along with JFET 234 when the voltage across capacitor C2 exceeds a first predefined threshold, for example, about 8V. Here both devices are switched on and off together when there is a possibility that JFET 234 cannot be completely turned off while the internal power supply is low. In some embodiments, the driver switches PMOS device on and off along with JFET 234 when the voltage across an internal regulated node exceeds a threshold voltage. As the half-bridge begins to switch on and off, the voltage of node 227 is pumped farther and farther below system ground 240 via capacitors C3 and diode D3. Once the voltage of node 227 is sufficiently below system ground 240, for example, at about −18V, PMOS device 236 is persistently turned on and operation proceeds in a normal mode of operation. In an embodiment, the supply threshold at which PMOS device 236 is persistently turned on is determined by the pinch-off voltage of the JFET 234 and an additional margin, for example, about 18V, to ensure reliable operation.

In some embodiments, switching both JFET 234 and PMOS 236 is not as efficient as keeping PMOS device 236 on and switching JFET 234 because driver 204 needs to charge and discharge the gate capacitance of PMOS device 236. In some embodiments, PMOS device 236 is made very large in order to reduce the series resistance to JFET 234; therefore, the gate-source capacitance of PMOS device 236 can be very high. During startup, however, switching both devices together allows both devices to operate safely without causing a short circuit in some embodiments. Once the full negative power supply voltage is developed at node 227, however, the persistently on state of PMOS 236 allows more efficient operation because the JFET device has a lower input capacitance per given drive strength than PMOS device 236. In further embodiments, concepts applied to the low-side driver circuit can also be applied to the high-side driver.

Figure 3A:
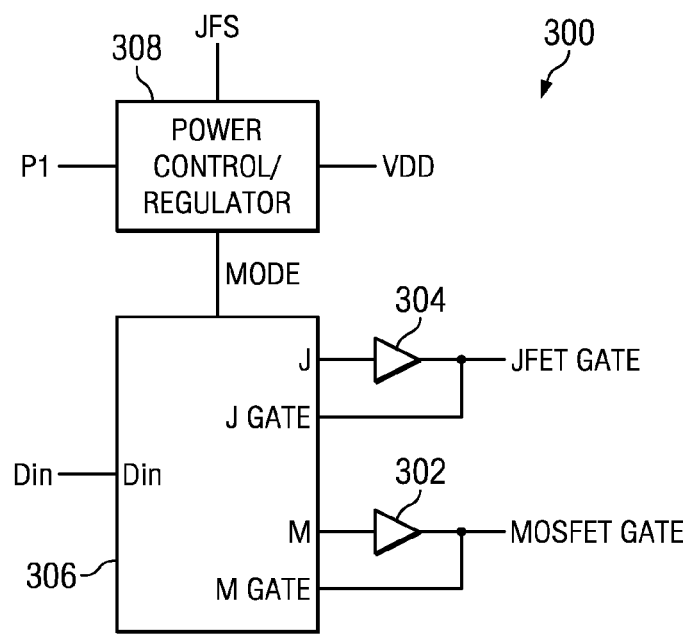
FIGS. 3a-3c illustrate schematics of an embodiment driver.

FIG. 3a illustrates a schematic of an embodiment driver circuit 300. In an embodiment, driver circuit 300 can be used for the driver blocks in FIGS. 1 and 2. In driver circuit 300, controller 306 drives JFET gate driver 304 and MOSFET gate driver 302. Controller 306 determines the timing of the drive signals to drivers 302 and 304 according to a mode of operation. For example, in a first mode of operation when the device is starting up, the MOSFET gate is disabled by driving the MOSFET gate to a high potential and switching is also disabled for the JFET gate by driving the JFET gate to a low voltage. In a second mode of operation, while the power supply is charging, both the MOSFET gate and the JFET gates are switched on and off together according to input signal Din. In a third mode of operation corresponding to a case of nominal operation, the MOSFET gate is turned on persistently. In an embodiment, power control block 308 uses input JFS as a positive supply and node P1 as a negative supply. In some embodiments, power control block 308 has a local voltage regulator and comparators used to determine the mode of operation. In the embodiment shown in FIG. 3a, power control block 308 outputs a MODE signal to controller 306. In some embodiments, the MODE signal can be a digital signal made of one or more bits. In alternative embodiments, power control, mode control, and signal control can be implemented and partitioned differently.

Figure 3B:
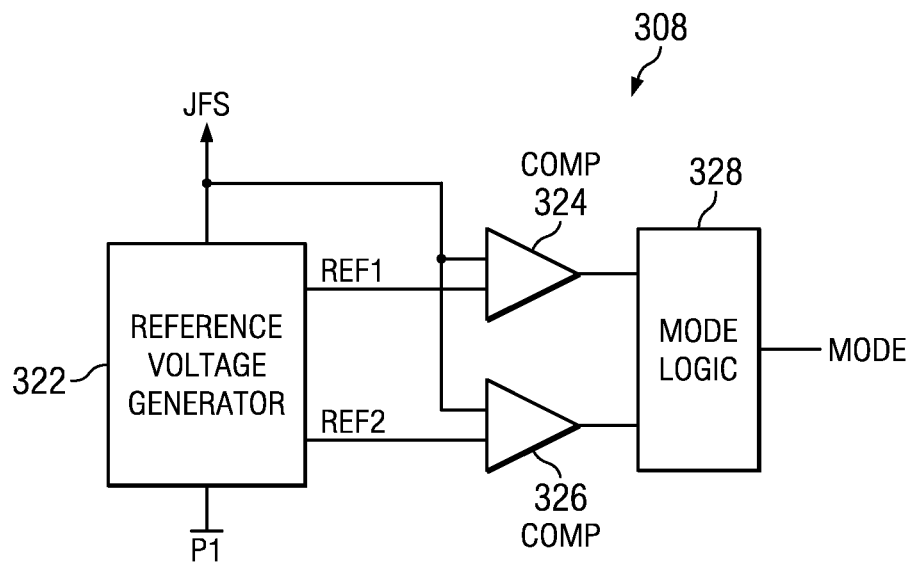

FIG. 3b illustrates an embodiment schematic of power control block 308, which has reference voltage generator 322 generating two voltages REF1 and REF2. In an embodiment, REF 1 is about 8V and REF2 is about 18V, however, in alternative embodiments, different voltages can be used. Comparators 324 and 326 compare voltages REF1 and REF2 to node JFS respectively. The results of the comparisons are processed by mode logic block 328, which outputs the MODE signal representing an operation mode. In alternative embodiments, other circuits can be used. For example, instead of using voltage JFS directly, a scaled down version of JFS can be compared against lower reference voltages. For example, in one embodiment, JFS is scaled down by a factor of 10 via a resistor divider, and compared to 0.8V and 1.8V. In such a low-voltage embodiment, low voltage devices can be used and saturation effects can be prevented.

Figure 3C:
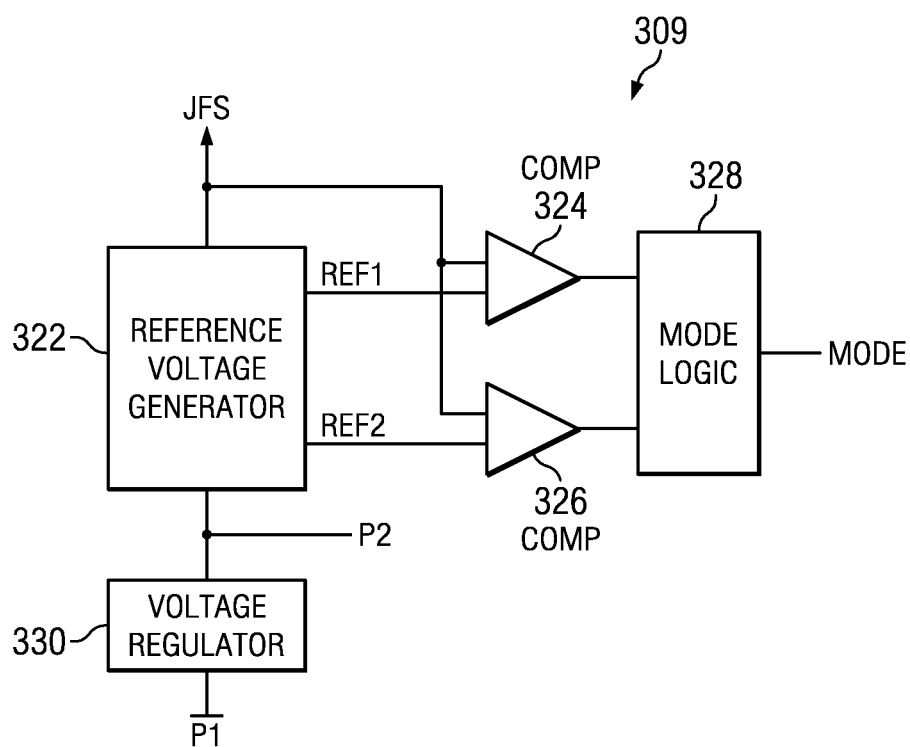

FIG. 3c illustrates alternative embodiment power control block 309. Power control block 309 is similar to power control block 308 of FIG. 3b, but also has voltage regulator 330 producing regulated voltage P2 from which reference voltages REF1 and REF2 are derived. In some embodiments, regulated voltage P2 is used to power the switch drivers and/or other circuitry associated with the switch drivers. In some embodiments, voltage regulator 330 is used to power the switch drivers and associated circuitry, while primary power supply P1 is used to derive reference voltages REF1 and REF2 via block 322 as configured in FIG. 3b.

Figure 4A:
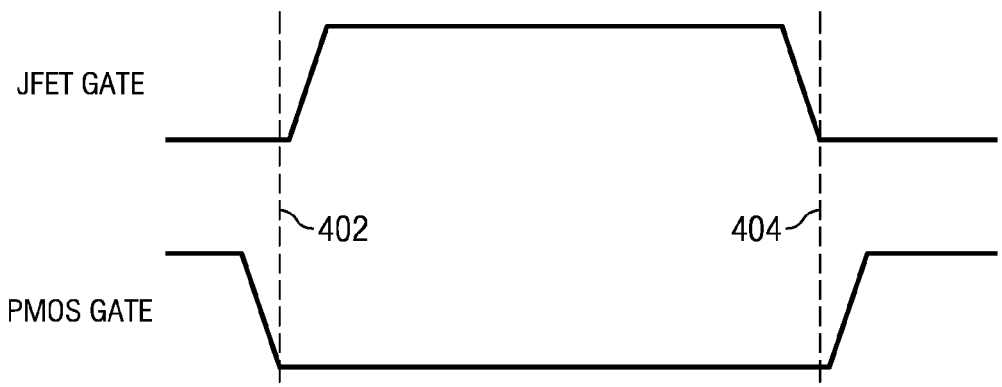
FIGS. 4a-4c illustrate a timing diagram and schematics of an embodiment switch control circuit.

In an embodiment, when the gates of the JFET and the MOSFET device are both being switched, for example, the JFET is turned on after the MOSFET device has been turned on, and the MOSFET is turned off after the JFET is turned off. This can happen, for example, in the second mode when the supply is charging after the power supply system has been started. In an embodiment, the MOSFET handles the pinch-off voltage of the JFET, therefore, a low-voltage MOSFET can be used when the JFET is a high voltage device. Accordingly, ensuring that the MOSFET is on when the JFET is on prevents device breakdown and the possible destruction of the MOSFET device. FIG. 4a illustrates a timing diagram of controller 306 and drivers 302 and 304 of FIG. 3a where a PMOS device is being used. Here, the JFET gate is driven high after the PMOS gate drive has gone low at time 402. Similarly, the PMOS gate is driven high after the JFET gate is driven low at time 404. In embodiments, where the MOSFET device is implemented using an NMOS device, the sense of signal PMOS GATE is inverted.

Figure 4B:
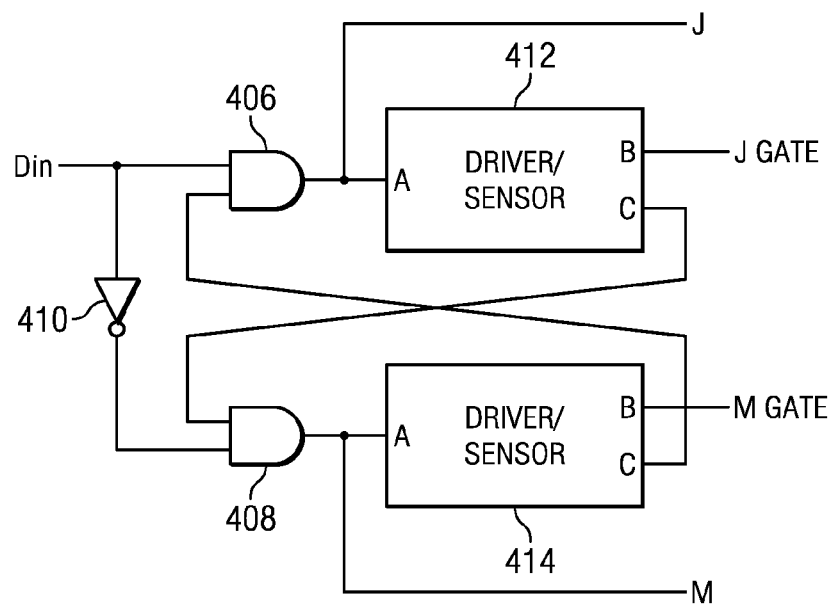

FIG. 4b illustrates a schematic of at least a portion controller 306 according to an embodiment of the present invention. Signal Din drives AND gate 406 directly, and AND gate 408 via inverter 410. The output of AND gate 406 drives driver/sensor 412 and JFET gate driver 304 (FIG. 3) and the output of AND gate 408 drives driver/sensor 414 and MOSFET driver 302 (FIG. 3). Output C of driver/sensor is fed to AND gate 408 and output C of driver/sensor 414 is fed to AND gate 406. In an embodiment, node C of driver/sensor 412 JFET does not go low until the JFET gate has gone low. Similarly, node C of driver sensor 414 does not go high until the MOSFET gate has gone low. Effectively, node C goes high if the driver/sensor senses that the associated node at input B has become low. By providing feedback from the actual gate driving nodes, the JFET is prevented from conducting when the MOSFET is turned off.

Figure 4C:
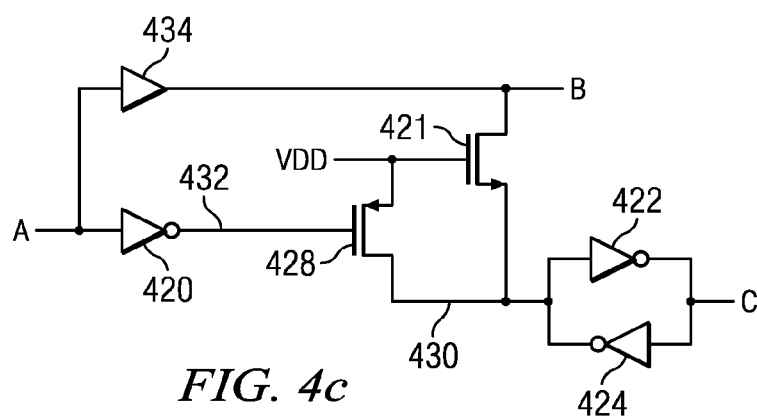

FIG. 4c illustrates an embodiment example of driver/sensor block 412 shown in FIG. 4b. The driver sensor has PMOS device 428 coupled to input A via inverter 420. PMOS device is coupled between VDD and input 430 of a latch made of back-to-back inverters 422 and 424. Gate feedback is also coupled to the latch via NMOS device 421. In one embodiment, NMOS device 421 is a high voltage device, although NMOS device 421 can also be implemented as a low voltage device. In some embodiments, buffer 434 is coupled between node A and node B. During operation, when the node 432 at the gate of PMOS device 428 is high the input of the latch is driven by input B, which corresponds to the drive signal of the PMOS or JFET drive signal. In some embodiments, PMOS device 428 can be omitted if node B can force input 430 to high state via NMOS device 421. The existence of PMOS device 428, however, helps to obtain a clean reset condition. In an embodiment, inverter 424 is made with a weak PMOS and/or NMOS device in order to let devices 421 and 428 override the output of inverter 424. In some embodiments, inverter 422 is also made with a weak PMOS and/or NMOS device to minimize cross-conduction during switching. In such an embodiment, inverter 422 can be followed by another buffer stage (not shown).

It should be appreciated that the circuit shown in FIGS. 4b and 4c are example embodiments. In alternative embodiments, other circuits and logic can be used besides the circuit illustrated in FIG. 4b.

Figure 5:
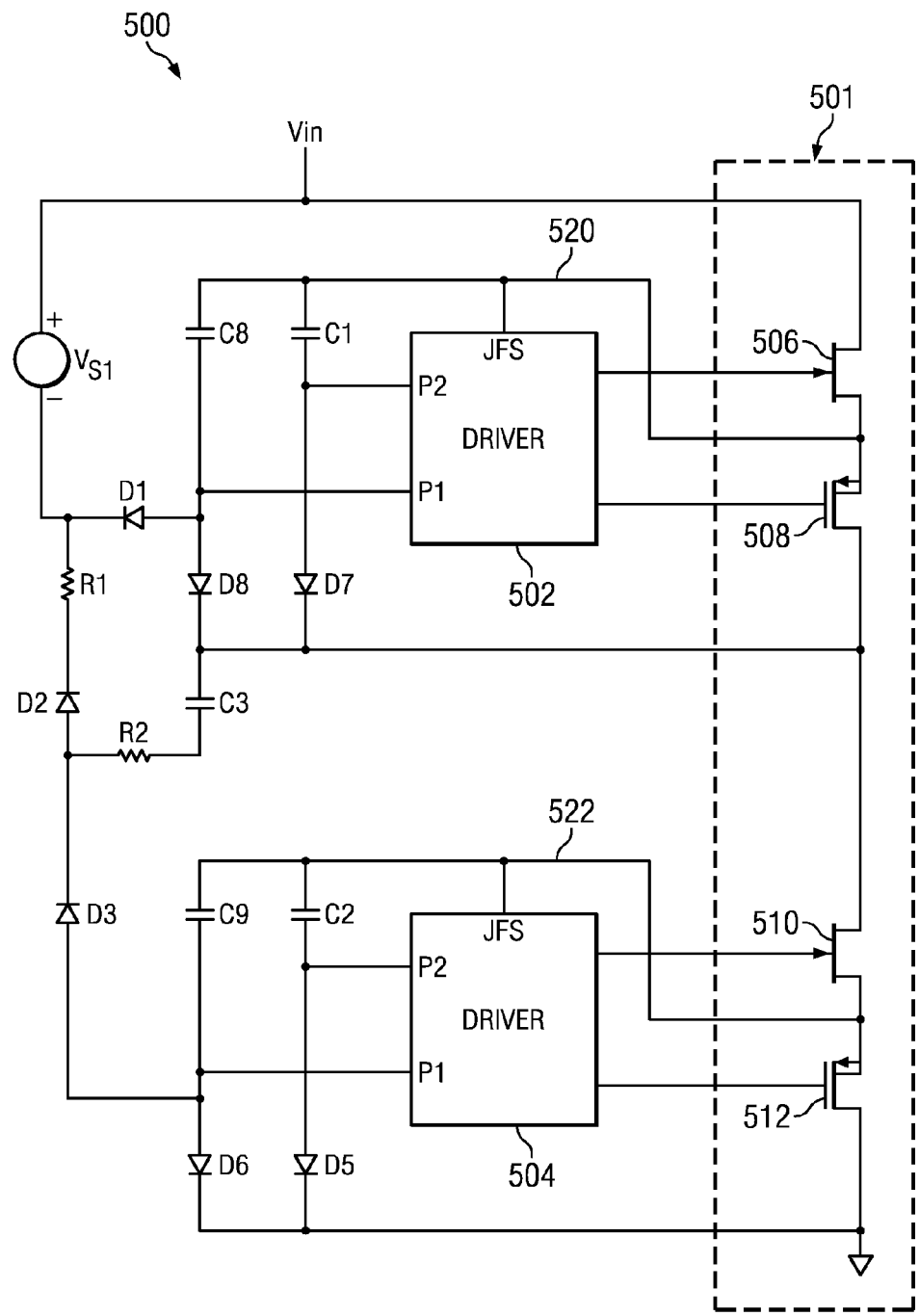
FIG. 5 illustrates a further embodiment switch driver system.

FIG. 5 illustrates another embodiment system 500 for driving half-bridge circuit 501. A high-side switch made of JFET 506 and PMOS device 508 are driven by high-side driver 502, and a low-side switch made of JFET 510 and 512 are driven by low-side driver 504. Operation of drivers 502 and 504 is similar to the operation of driver 204 shown in FIG. 2, and drivers 102 and 104 shown in FIG. 1a. Each driver, however, has two power supply terminals P1 and P2 and each switch has a JFET and a MOSFET. In an embodiment, power supply terminal P1 is used to supply the driver with a primary supply and power supply terminal P2 is used to supply the driver with a regulated supply. In an embodiment, the regulated supply is generated from the primary supply with a voltage regulator within block 308 of FIG. 3a. In one embodiment, power supply terminal P2 operates at between about −18V and about −19V, and power supply terminal P1 operates at between about −24V and −26V. In alternative embodiments, other voltage ranges and/or additional supply terminals can be used.

In an embodiment, supply P1 of high-side driver 502 is supplied via D1. Supply P2 is supplied via an internal regulation circuit and decoupled to node 520 via capacitor C1. Similarly, supply P1 of low-side driver 504 is supplied via C3 and D3. Supply P2 is supplied via an internal regulation circuit and decoupled to node 522 via capacitor C2. In some embodiments, power control block 309 shown in FIG. 3c can be used. Resistors R1 and R2 limit the current peaks that otherwise might damage or destroy the diodes, especially at startup. Diodes D5, D6, D7 and D8 are reversed-biased during normal operation, but become forward biased when power supply nodes P1 and P2 have a voltage greater than a driver ground node in order to protect driver circuitry from latch-up, breakdown, and over voltage conditions. Diodes D5, D6, D7 and D8 also provide a charging path for capacitors C1, C2, C8 and C9 during startup when no bootstrap voltage is available.

Figure 6:
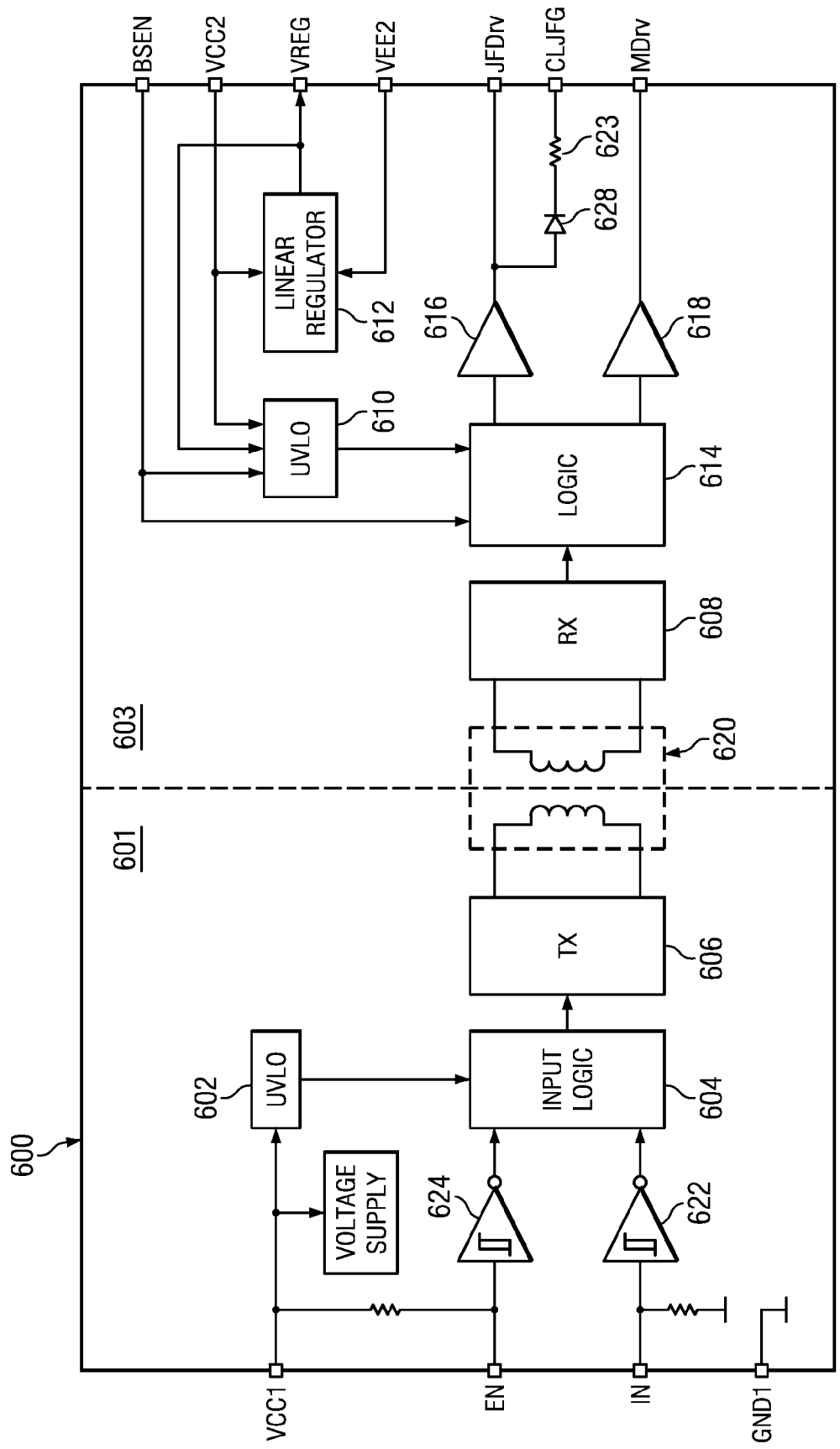
FIG. 6 illustrates an embodiment driver circuit.

FIG. 6 illustrates driver circuit 600 according to an embodiment of the present invention. Driver circuit 600 has low voltage section 601 coupled to high voltage section 603 via coreless transformer 620. In alternative embodiments, low voltage section 601 can be coupled to high voltage section 603 via an optocoupler. Low voltage section 601 accepts driver data at pin IN, which is coupled to coreless transformer 620 via buffer 622, input logic 604 and transformer driver 606. In an embodiment, low voltage section 601 also accepts an enable signal at pin EN, which is coupled to input logic 604 via buffer 624. Under Voltage Lock Out (UVLO) circuit 602 disables the output of input logic block 604 when power supply VCC1 is below a minimum operating voltage. In some embodiments VCC1 is about 5V, however, in alternative embodiments, other supply voltages can be used. In an embodiment, enable signal EN is used to enable operation of driver circuit 600. In an embodiment, driver circuit 600 is implemented as a plurality of components within a single package, such as a system in package (SIP). In one embodiment, within the package, low voltage section 601 is partitioned on a first integrated circuit (IC), high voltage section 603 is partitioned on a second IC, and coreless transformer 620 is partitioned on the first IC or the second IC. Alternatively, driver circuit 600 can be implemented as an integrated circuit (IC) or within multiple packages.

High voltage section 603 has coreless transformer receiver 608, driver logic 614, JFET driver 616, and MOSFET driver 618. Linear regulator 612 provides regulated voltage VREG from power supply input s VCC2 and VEE2. In an embodiment, diode 628 and resistor 623 are coupled to input CLJFG to prevent the gate of the driven JFET from attaining a voltage significantly above the drain potential of the driven MOSFET. UVLO circuit 610 provides logic block 614 power supply status so that logic block 614 can derive a supply dependent mode of operation. In an embodiment, bootstrap enable signal BSEN is used to enable embodiment operation modes. In further embodiments, signal BSEN can be omitted.

Figure 7A:
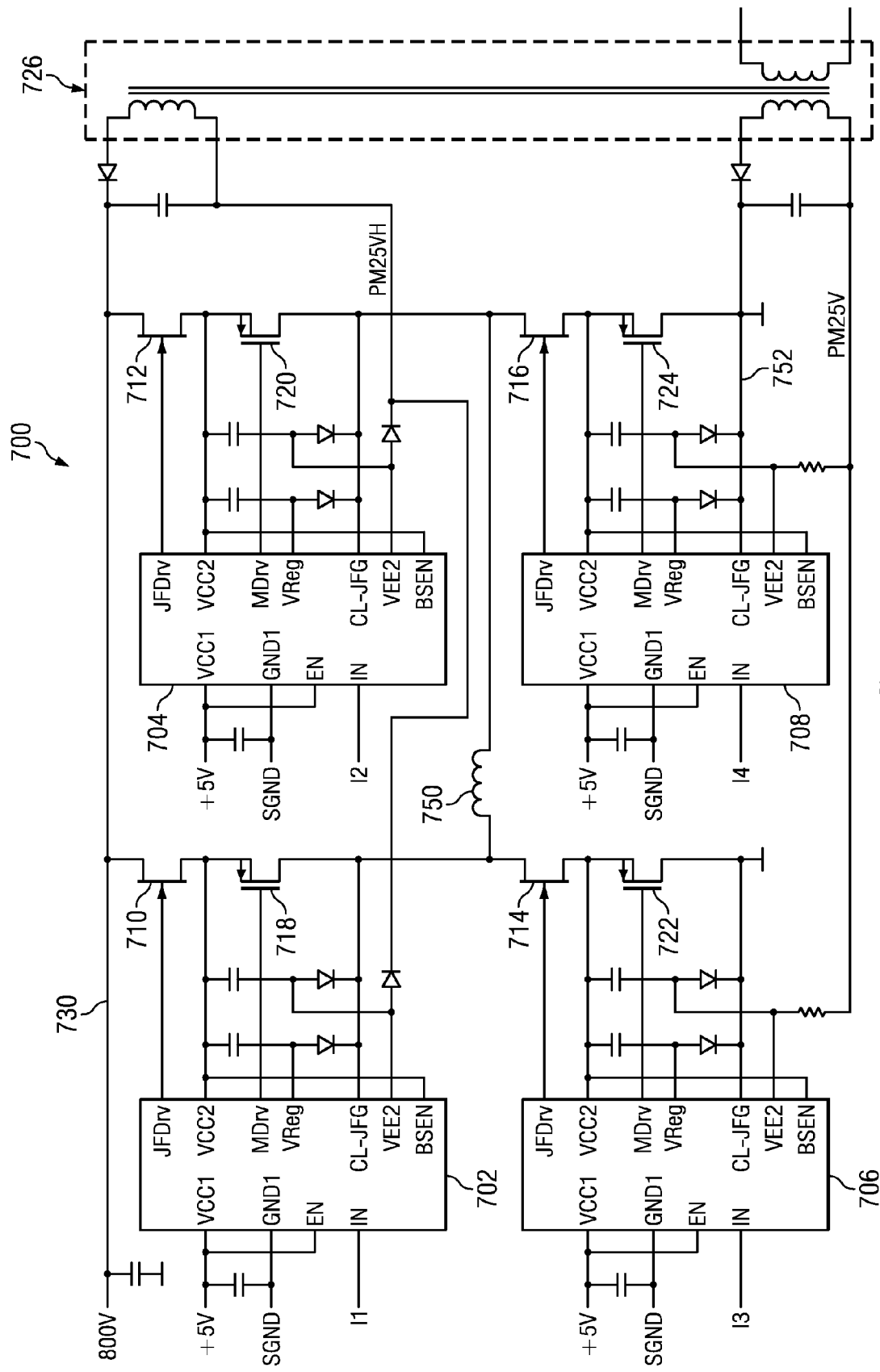
FIGS. 7a-7b illustrate embodiment power supply systems using embodiment driver circuits.

FIG. 7a illustrates an embodiment full-bridge power supply 700 using embodiment drivers 702, 704, 706 and 708. High-side driver 702 is coupled to JFET 710 and MOSFET 718, high-side driver 704 is coupled to JFET 712 and MOSFET 720, low-side driver 706 is coupled to JFET 714 and MOSFET 722, and low-side driver 708 is coupled to JFET 716 and MOSFET 724. In an embodiment, power is supplied to a load represented by inductor 750 and/or a load coupled to the terminals of inductor 750. Transformer 726 charges nodes PM25V and PM25VH to provide a negative supply to terminals VEE2 on drivers 702, 704, 706 and 708. In an embodiment, nodes PM25V and PM25VH are charged to about −25V with respect to primary supply 730 and system ground 752, respectively. Alternatively, nodes PM25V and PM25VH can be charged to other voltages. In one embodiment, the second mode of operation, in which both the JFET and the MOSFET switch at the same time, is not performed when pins VEE2 in drivers 706 and 708 receive power at node PM25V. Primary supply 730 operates at about 800V. However, in other embodiments, different voltages can be used. Signals I1, I2, I3 and I4 control the switching of power supply drivers 702, 704, 706 and 708.

Figure 7B:
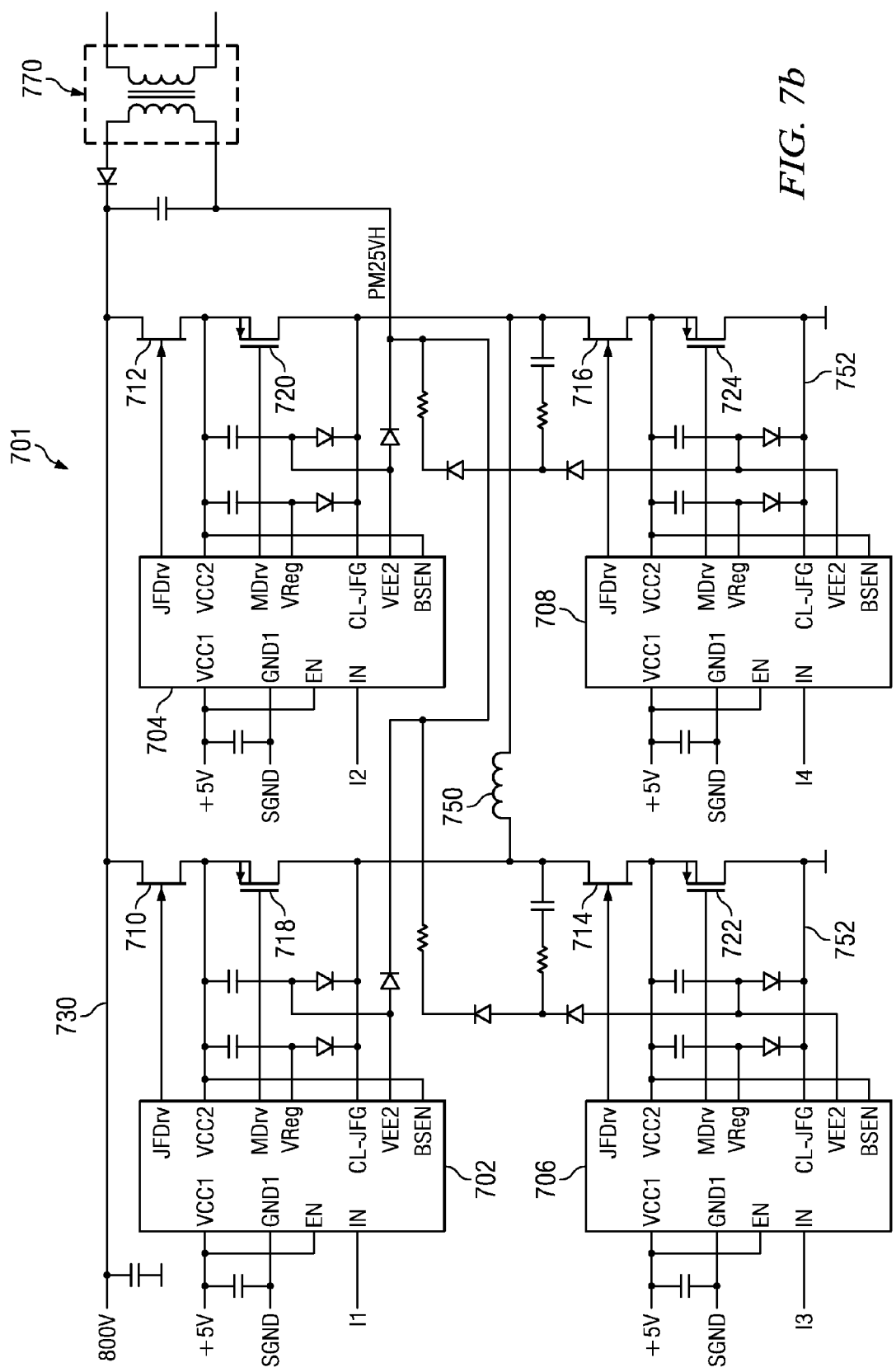

FIG. 7b illustrates embodiment full-bridge power supply 701 in which supply pin VEE2 in low-side drivers 706 and 708 receive power using embodiment bootstrapping methods instead of from a secondary winding of transformer 726 (FIG. 7a). Here, transformer 770 provides power for node PM25VH. An advantage of such an embodiment includes cost savings gained from using a less expensive transformer.

In an alternative embodiment, with respect to high side drivers 702 and 704, if the circuitry between nodes VCC1 and GND1 in the drivers can withstand 25V, for example between nodes 730 and PM25VH, and if the positive supply of controller system steering inputs I1-I4 are connected to Vin (node 730) then PM25VH can be used as supply for both the high voltage and low voltage circuitry within the drivers. In such an embodiment, a diode is coupled between the supplies. Therefore, a common supply can be used for the controller and the high-side switch driver having a bootstrap diode in between. With respect to low side drivers 706 and 708, a similar concept can be applied if the controller is referenced to the system ground instead of the high-side reference nodes. In such an embodiment, a diode does not need to be coupled between the supplies. Therefore, a common supply can be used for the controller and low-side switch drivers.

Figure 8:
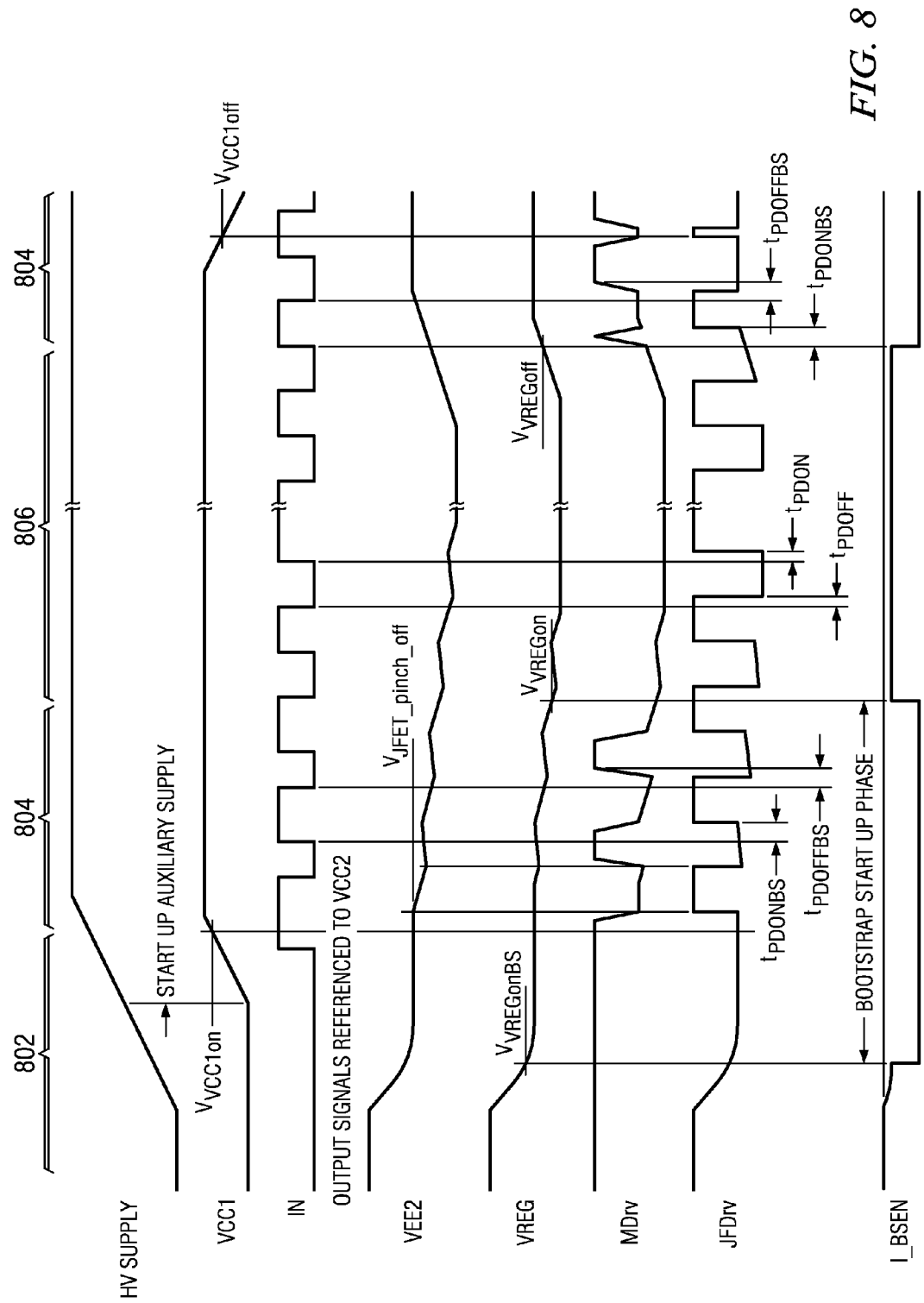
FIG. 8 illustrates an embodiment waveform diagram of an embodiment driver circuit.

FIG. 8 illustrates a waveform diagram of the operation of an embodiment power supply driver. During phase 802, high voltage system supply HV supply ramps up and powers up VEE2, VREG and JFDrv. (Note that these nodes are referenced to VCC2 in FIG. 8.) During phase 802, signal JFDrv is driven low and driver signal MDrv remains high, thereby keeping the driven MOSFET off. During phase 804, MDrv and JFDrv are toggled together as described herein with respect to other embodiments of the present invention. Furthermore, in some embodiments, auxiliary supply VCC1 and/or node PM25VH coupled to node VEE2 (FIG. 7b) becomes fully activated.

Once VREG reaches its fully regulated voltage and crosses threshold $V_{VREGon}$, the driver begins operating in normal operation mode 806. Here, signal MDrv is low with respect to VCC2, while JFDrv continues to toggle. This corresponds to a mode of operation where the MOSFET remains on while the JFET continues switching. During operation mode 806, I_BSEN, which is driver circuit output pin indicating that normal operation mode 806 is active, goes high. In some embodiments, I_BSEN is implemented as a bidirectional pin that senses a voltage when used as an input and produces a current when used as an output.

If regulated voltage VREG crosses threshold $V_{VREGoff}$, operation mode 804 is re-entered and signals MDrv and JFDrv are toggled together. In some embodiments, VREG crosses threshold $V_{VREGoff}$ when VEE2 drops, thereby causing a loss of power at VREG. This can also be caused, for example, by loss of supply 110 (FIG. 1a). In some embodiments, hysteresis is applied by setting threshold $V_{VREGon}$ different from threshold $V_{VREGoff}$ in order to prevent excessive toggling between operation modes.

In an embodiment, the high-side driver and the low-side driver can be implemented on the same integrated circuit. Alternatively, each driver can be implemented on separate integrated circuits. In some embodiments, the half-bridge circuit can also be disposed on the same integrated circuit as one or both of the drivers.

In alternative embodiments, embodiment driver systems can also be used to drive other types of circuits such as full-bridge switches and motors.

In accordance with an embodiment, a circuit for driving a switch includes a driver circuit. The driver circuit includes a first output configured to be coupled to a gate of the JFET, a second output configured to be coupled to a gate of the MOSFET, a first power supply node, and a bias input configured to be coupled to the common node. The switch to be driven includes a JFET coupled to a MOSFET at a common node. In some embodiments, the circuit is disposed on an integrated circuit. In some embodiments, the JFET comprises a high-voltage JFET and the MOSFET comprises a low-voltage MOSFET.

In an embodiment, the driver circuit is configured to operate with a capacitor coupled between the first power supply node the first output of the JFET, and a first network coupled between the first power supply node and a second output of the JFET. In an embodiment, the first network has a diode and a second capacitor coupled in series. In some embodiments, driver circuit receives power from the bias input during startup of the circuit.

In an embodiment, the driver circuit keeps the MOSFET off when a reference supply voltage is below a first threshold voltage, the driver circuit operates the MOSFET and the JFET together when the reference supply voltage is between the first threshold voltage and a second threshold voltage, and the driver circuit keeps the MOSFET on when the reference supply voltage is greater than the second threshold voltage. In an embodiment, the driver circuit operates the MOSFET and the JFET together by turning on the MOSFET before turning on the JFET, and turning off the JFET before turning off the MOSFET. In a further embodiment, the reference supply voltage is proportional to a voltage of an internal power supply source. Alternatively, the reference supply voltage is proportional to a voltage of the bias input.

In an embodiment, the circuit further includes a reference voltage generator generating the first threshold voltage and the second threshold voltage, a first comparator having a first input coupled to the reference supply voltage and a second input coupled to the first threshold voltage, and a second comparator having a first input coupled to the reference supply voltage and a second input coupled to the second threshold voltage.

In accordance with another embodiment, a switch driver includes a first switch driver output configured to be coupled to a gate of a JFET device, a second switch driver output configured to be coupled to a gate of a MOSFET device, a first power supply node, and a bias input configured to be coupled to a first output node of the JFET device and a first output node of the MOSFET device. In an embodiment, a method of operating the switch driver includes switching the first switch driver output during startup, where switching the first switch driver output during startup includes operating the switch driver using the bias input as a supply node.

In an embodiment, the method of operating the switch driver also includes switching the first switch driver output and the second switch driver output together when supply nodes of the switch driver are ramping up from an initial startup condition, and keeping the second switch driver output in a state configured to keep the MOSFET device on while switching the first switch driver output on and off after the supply nodes of the switch driver are charged to a full operating state. In a further embodiment, the method includes keeping the second switch driver output in a state configured to keep the MOSFET device off at an initial startup of the switch driver. In some embodiments, the method further includes switching the first switch driver output and the second switch driver output together when together when a reference supply voltage is between a first threshold voltage and a second threshold voltage. Furthermore, the method can include keeping the second switch driver output in a state configured to keep the MOSFET device on while switching the first switch driver output on and off when the reference supply voltage is greater than the second threshold voltage.

In some embodiments, the method includes keeping the second switch driver output in a state configured to keep the MOSFET device off when the reference supply voltage is below the first threshold voltage.

In an embodiment, switching the first switch driver output and the second switch driver output together includes activating the second switch driver output to turn on the MOSFET device before activating the first switch driver output to turn on the JFET device, and deactivating the first switch driver output to turn off the JFET device before deactivating the second output to turn off the MOSFET device.

In accordance with a further embodiment, a switch driver includes a first output configured to be coupled to a gate of a JFET, and a second output configured to be coupled to a gate of a MOSFET coupled in series with the JFET. In an embodiment, a method for operating the switch driver includes switching the first output and the second output together when a supply node of the switch driver is ramping up from an initial startup condition, and keeping the second output in a state configured to keep the MOSFET on while switching the first output on and off after the supply node of the switch driver is charged to a full operating state. The method further includes keeping the second output in a state configured to keep the MOSFET off at an initial startup of the switch driver. In an embodiment, the method includes driving the JFET with the first output and driving the MOSFET with the second output.

In an embodiment, the method further includes determining if the supply node of the switch driver is ramping up from an initial startup condition, determining if the supply node of the switch driver is charged to a full operating state, and determining if the switch driver is at an initial startup state.

In an embodiment, determining if the supply node of the switch driver is ramping up from an initial startup condition includes determining if a reference supply voltage is within a first voltage range. In some embodiments, determining if the supply node of the switch driver is charged to a full operating state includes determining if the reference supply voltage is within a second voltage range, and determining if the switch driver is at an initial startup state includes determining if the reference supply voltage is within a third supply voltage range.

In an embodiment, the method further includes switching the first output during startup, which includes operating the switch driver using a bias input as a power supply, where the bias input configured to be coupled to a common node between the JFET and the MOSFET.

In accordance with a further embodiment, a circuit for driving a half-bridge has a plurality of switches having a JFET in series with a MOSFET. In an embodiment, a method for operating the circuit for driving the half-bridge includes operating the circuit in a first mode if a power supply node of the circuit has a voltage less than a first threshold. In an embodiment, operating the circuit in the first mode includes keeping the MOSFET off, and charging the power supply node of the circuit with the drain of the JFET. In an embodiment, the method also includes operating the circuit in a second mode if the power supply node of the circuit has a voltage greater than the first threshold and less than a second threshold. Operating the circuit in the second mode includes switching the MOSFET and the JFET. The method also includes operating the circuit in a third mode if the power supply node of the circuit has a voltage greater than the second threshold. In an embodiment, operating the circuit in the third mode includes keeping the MOSFET on and switching the JFET.

In an embodiment, operating the circuit in the second mode further includes turning on the MOSFET before turning on the JFET, and turning off the JFET before turning off the MOSFET. In some embodiment, the half-bridge is operates in a power-supply circuit. In a further embodiment, operating the circuit in a first mode further includes applying a reference potential to a gate of the JFET.

Advantages of embodiments of the present invention include the ability to bias a low-side driver without using additional transformers by pumping charge from an output of a half-bridge circuit.

Although present embodiments and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for driving a switch, the switch comprising a JFET coupled to a MOSFET at a common node, the circuit comprising:
   a driver circuit comprising
      a first output configured to be coupled to a gate of the JFET,
      a second output configured to be coupled to a gate of the MOSFET,
      a first power supply node, and
      a bias input configured to be coupled to the common node, wherein the driver circuit is configured to receive power from the bias input during startup of the circuit.

2. The circuit of claim 1, wherein the circuit is disposed on an integrated circuit.

3. The circuit of claim 1, wherein the driver circuit is configured to operate with:
   a capacitor coupled between the first power supply node and a first output of the JFET; and
   a first network coupled between the first power supply node and a second output of the JFET, the first network comprising a diode and a second capacitor coupled in series.

4. The circuit of claim 1, further comprising the JFET and the MOSFET.

5. The circuit of claim 1 wherein the JFET comprises a high-voltage JFET and the MOSFET comprises a low-voltage MOSFET.

6. The circuit of claim 1, wherein:
   the driver circuit is configured to keep the MOSFET off when a reference supply voltage is below a first threshold voltage;
   the driver circuit is configured to operate the MOSFET and the JFET together when the reference supply voltage is between the first threshold voltage and a second threshold voltage; and
   the driver circuit is configured to keep the MOSFET on when the reference supply voltage is greater than the second threshold voltage.

7. The circuit of claim 6, wherein the reference supply voltage is proportional to a voltage of an internal power supply source.

8. The circuit of claim 7, further comprising:
   a reference voltage generator configured to generate the first threshold voltage and the second threshold voltage;
   a first comparator having a first input coupled to the reference supply voltage and a second input coupled to the first threshold voltage; and
   a second comparator having a first input coupled to the reference supply voltage and a second input coupled to the second threshold voltage.

9. The circuit of claim 6, wherein the reference supply voltage is proportional to a voltage of the bias input.

10. The circuit of claim 6, wherein the driver circuit is configured to operate the MOSFET and the JFET together by turning on the MOSFET before turning on the JFET, and turning off the JFET before turning off the MOSFET.

11. A method of operating a switch driver comprising a first switch driver output configured to be coupled to a gate of a JFET device, a second switch driver output configured to be coupled to a gate of a MOSFET device, a first power supply node, and a bias input configured to be coupled to a first output node of the JFET device and a first output node of the MOSFET device, the method comprising:
   switching the first switch driver output during startup, switching the first switch driver output during startup comprising receiving power from the bias input.

12. The method of claim 11, further comprising:

switching the first switch driver output and the second switch driver output together when supply nodes of the switch driver are ramping up from an initial startup condition; and keeping the second switch driver output in a state configured to keep the MOSFET device on while switching the first switch driver output on and off after the supply nodes of the switch driver are charged to a full operating state.

13. The method of claim 12, further comprising keeping the second switch driver output in a state configured to keep the MOSFET device off at an initial startup of the switch driver.

14. The method of claim 11, further comprising:
switching the first switch driver output and the second switch driver output together when together when a reference supply voltage is between a first threshold voltage and a second threshold voltage; and keeping the second switch driver output in a state configured to keep the MOSFET device on while switching the first switch driver output on and off when the reference supply voltage is greater than the second threshold voltage.

15. The method of claim 14, further comprising keeping the second switch driver output in a state configured to keep the MOSFET device off when the reference supply voltage is below the first threshold voltage.

16. The method of claim 14, wherein switching the first switch driver output and the second switch driver output together comprises:
activating the second switch driver output to turn on the MOSFET device before activating the first switch driver output to turn on the JFET device; and deactivating the first switch driver output to turn off the JFET device before deactivating the second output to turn off the MOSFET device.

17. A method of operating a switch driver comprising a first output configured to be coupled to a gate of a JFET, and a second output configured to be coupled to a gate of a MOSFET coupled in series with the JFET, the method comprising:
switching the first output and the second output together when a supply node of the switch driver is ramping up from an initial startup condition;

keeping the second output in a state configured to keep the MOSFET on while switching the first output on and off after the supply node of the switch driver is charged to a full operating state; and keeping the second output in a state configured to keep the MOSFET off at an initial startup of the switch driver.

18. The method of claim 17, further comprising:
determining if the supply node of the switch driver is ramping up from an initial startup condition;

determining if the supply node of the switch driver is charged to a full operating state; and determining if the switch driver is at an initial startup state.

19. The method of claim 17, wherein:
determining if the supply node of the switch driver is ramping up from an initial startup condition comprises determining if a reference supply voltage is within a first voltage range;

determining if the supply node of the switch driver is charged to a full operating state comprises determining if the reference supply voltage is within a second voltage range; and determining if the switch driver is at an initial startup state comprises determining if the reference supply voltage is within a third supply voltage range.

20. The method of claim 17, further comprising driving the JFET with the first output and driving the MOSFET with the second output.

21. The method of claim 17, further comprising switching the first output during startup, switching the first output during startup comprising operating the switch driver using a bias input as a power supply, the bias input configured to be coupled to a common node between the JFET and the MOSFET.

22. A method of operating a circuit for driving a half-bridge comprising a plurality of switches having a JFET in series with a MOSFET, the method comprising:
operating the circuit in a first mode if a power supply node of the circuit has a voltage less than a first threshold, operating the circuit in the first mode comprising,
keeping the MOSFET off,
charging the power supply node of the circuit with a drain of the JFET;

operating the circuit in a second mode if the power supply node of the circuit has a voltage greater than the first threshold and less than a second threshold, operating the circuit in the second mode comprising,
switching the MOSFET and the JFET; and operating the circuit in a third mode if the power supply node of the circuit has a voltage greater than the second threshold, operating the circuit in the third mode comprising keeping the MOSFET on and switching the JFET.

23. The method of claim 22, wherein operating the circuit in the second mode further comprises turning on the MOSFET before turning on the JFET, and turning off the JFET before turning off the MOSFET.

24. The method of claim 22, further wherein the half-bridge is operating in a power-supply circuit.

25. The method of claim 22, wherein operating the circuit in a first mode further comprises applying a reference potential to a gate of the JFET.

* * * * *

UNITED STATES PATENT AND TRADEMARK OFFICE
CERTIFICATE OF CORRECTION

PATENT NO. : 8,487,664 B2
APPLICATION NO. : 12/956852
DATED : July 16, 2013
INVENTOR(S) : Draxelmayr et al.

It is certified that error appears in the above-identified patent and that said Letters Patent is hereby corrected as shown below:

In the Claims:

In Col. 12, line 25, claim 5, after "The circuit of claim 1" insert --,--.

Signed and Sealed this
Twenty-fourth Day of September, 2013

Teresa Stanek Rea
*Deputy Director of the United States Patent and Trademark Office*